Sept. 10, 1963 WEN Y. PAN 3,103,637
WIDE BAND ELECTRIC TUNING UTILIZING DIODES
Filed Nov. 19, 1958
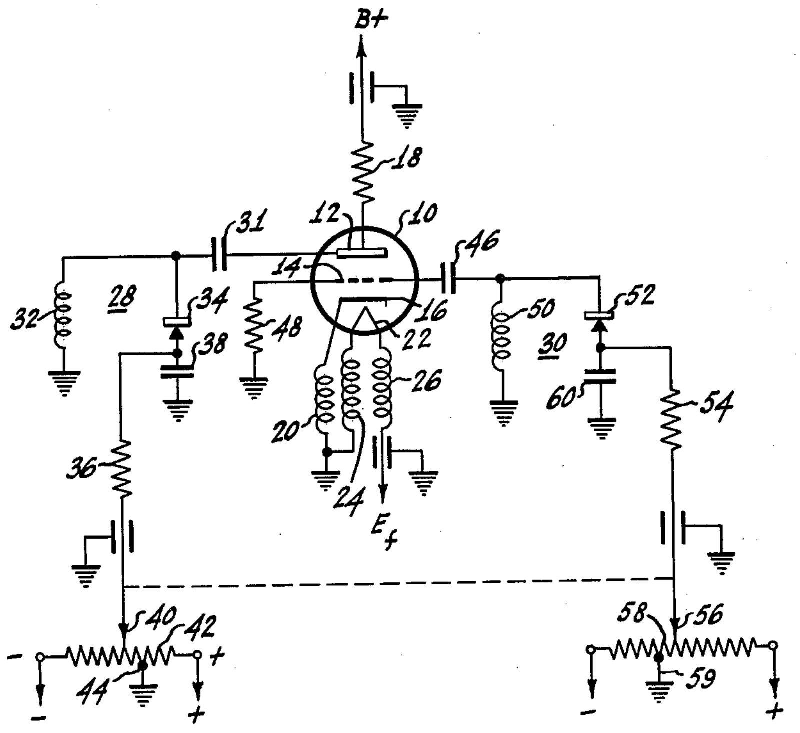
INVENTOR.
WEN YUAN PAN
BY Albert Russinoff
ATTORNEY United States Patent Office 3,103,637

Patented Sept. 10, 1963

3,103,637

WIDE BAND ELECTRIC TUNING UTILIZING DIODES

Wen Y. Pan, Haddon Heights, N.J., assignor to Radio Corporation of America, a corporation of Delaware Filed Nov. 19, 1958, Ser. No. 774,933
6 Claims. (Cl. 331—59)

This invention relates to tunable resonant circuits and more particularly to electric tuning circuits which are responsive to control voltages or currents to provide coarse or vernier changes in frequency over an extended frequency range.

It is an object of this invention to provide improved electric tuning circuits using voltage-responsive reactance devices as the tunable elements thereof which may be tuned over a wide range of frequencies or which may be tuned over widely separated ranges of frequencies.

A further object of this invention is to provide an improved tunable oscillator circuit employing voltage-responsive reactance devices as the tunable element thereof to provide multiband operation.

A tuning circuit in accordance with the invention includes a voltage-responsive variable capacitance device which serves the dual function of providing the tunable reactance element for the tuning circuit and also operating as a switch which may, for example, be a frequency band-changing switch. The term voltage-responsive variable capacity device as used herein designates any device which exhibits useable variations in capacity at a first impedance level in response to variations in current or voltage of a first range of magnitudes, and exhibits a substantial change in impedance level for a predetermined voltage or current outside of said range of magnitudes. An example of such a device is a voltage-responsive variable capacity diode which is responsive to variations in reverse bias to exhibit variations in capacitance at a high impedance level and responsive to a forward bias to exhibit a very low impedance. The tuning circuit of the invention is particularly adaptable for use in systems providing extended tuning ranges while eliminating the mechanical switching or adjusting mechanisms associated with conventional wide band tuning circuits. Furthermore, electronic apparatus using the electric tuning feature of the tuning circuit of the invention may be adapted for remote control operation in a simple and economical manner.

One application for the electric tuning circuit of the invention is for tuning wide band or multiband oscillators. Such an oscillator may include a first tuning circuit including a variable capacitance junction diode connected with the anode of the oscillator tube such that for signal frequencies the diode is connected between the anode and ground. A second tuning circuit which may also include a variable capacitance junction diode is connected with the oscillator grid such that the diode is effectively connected between grid and ground for signal frequencies. To tune the oscillator over a first range of frequencies a forward bias is applied to the second diode so that the oscillator grid is effectively at ground potential for signal frequencies, and a reverse bias is applied to the first diode, the magnitude of which determines the resonant frequency of the first tuning circuit. Under such conditions the oscillator is connected to operate as a grounded grid oscillator with the frequency of oscillation being determined by the first tuning circuit, and with the second circuit effectively disconnected, since the oscillator grid is at signal ground potential. For tuning over a second range of frequencies, contiguous to or removed from the first range of frequencies, a forward bias is applied to the first diode and an adjustable reverse bias is applied to the second diode. For these conditions the oscillator is connected to operate as a grounded plate oscillator with the frequency of oscillation being determined by the second tuning circuit.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the sole FIGURE is a schematic circuit diagram of a multiband oscillator particularly adapted for use as the local oscillator of a VHF television receiver.

Commercial television receivers must be capable of receiving any one of a plurality of television signals in the assigned frequency range of 54–88 and 174 to 216 megacycles. A selected signal is heterodyned with a signal from a local oscillator which is tuned to a frequency above or below the frequency of the selected signal by the amount of the receiver intermediate frequency. Usually the oscillator is tuned above the incoming signal frequency, and therefore must be tunable over a range of frequencies from 101–129 megacycles and 221–257 megacycles for television receivers having 47 megacycles intermediate frequency channel.

In accordance with the present invention voltage responsive variable capacity devices are used to provide tuning over a wide frequency range, such as that of the VHF television band. Although the invention is described in the environment of a local oscillator, it will be appreciated by those skilled in the art that the invention may be applied as well to other tuning circuit functions, such as the signal selection circuits of a television receiver.

The multiband oscillator circuit shown in the drawing includes a triode electron tube 10 having an anode 12, a control grid 14 and a cathode 16. The anode 12 is connected through a D.C. voltage dropping resistor 18 to a source of operating potential B+, and the cathode 16 is connected to ground through an inductor 20 to raise the cathode above ground potential for signal frequencies. As shown in the drawing, the cathode is heated by a filament 22 which is connected through a pair of choke coils 24 and 26 to the filament voltage supply $E_f$.

The multiband oscillator is provided with a pair of tunable resonant circuits 28 and 30. The circuit 28 is connected to the anode 12 through a D.C. blocking capacitor 31 and includes an inductor 32 which is tuned by the capacitance exhibited by a diode 34, which may, for example, comprise a variable capacitance junction diode. The capacitance of the junction diode 34 is controlled by controlling the amplitude of the reverse bias which is applied to the diode through the resistor 36. A blocking capacitor 38 is connected to provide a low impedance path at oscillator frequencies from the diode 34 to ground.

The reverse bias applied to the diode 34 is derived from a movable contact 40 on a resistor 42. The opposite ends of the resistor 42 are connected to the positive and negative terminals of a direct current voltage source, and an intermediate tap on the resistor is grounded. It will be seen that as the movable contact 40 is moved along the resistor 42 to the left of the ground connection 44 (nearer the negative terminal), a reverse bias is applied to the diode 34. However, if the contact 40 is moved to the right of the ground connection 44 (nearer the positive terminal), a forward bias is applied to the diode 34 causing the diode to conduct and appear as a very low impedance. This effectively connects the anode 12 to ground for signal frequencies through the blocking capacitors 31 and 38.

The control grid 14, which is connected to ground for direct currents through a grid leak resistor 48, is also connected to the tunable circuit 30 through a blocking capacitor 46. The tunable circuit 30 includes an inductor 50 which is tuned by a variable capacitance junction diode 52. The diode 52 is returned to ground through a signal bypass capacitor 60. The capacitance of the diode 52 is controlled by the amplitude of the reverse bias which is applied thereto through a resistor 54. To control the amplitude of this voltage a contact 56 is moved along resistor 58, the opposite ends of which are connected to the positive and negative terminals respectively of a D.C. voltage source. In this position shown the contact 56 is to the right of the ground tap 59 nearer the positive terminal and the voltage applied to the anode of the diode 52 is positive, thereby biasing the diode in the forward direction such that it appears effectively as a low impedance and thereby grounds the control grid 14 for signal frequencies through the capacitors 46 and 60. When the contact 56 is positioned to the left of the ground tap 59 on the resistor 58, a reverse bias is applied to the diode 52, and the magnitude of the reverse bias determines the amount of capacity presented to the tunable circuit 30.

For operation over the frequency range of 101 to 129 megacycles the diode 52 is provided with a forward bias by positioning the contact 56 to the right of the ground tap 59 of the resistor 58. This conditions the oscillator for grounded grid operation with the necessary feedback to sustain oscillation being provided through the interelectrode capacities of the tube 10. The oscillator is tunable over the desired frequency range by varying the contact 40 along the resistor 42 to the left of the ground point 44 such that a variable reverse bias is applied to the diode 34. The variable reverse bias provides corresponding variations in diode capacitance which changes the tuning of the oscillator in the desired manner.

For oscillator operation over the upper range of frequencies from 221 to 257 megacycles the contact 40 is moved to the right of the ground point 44 such that a positive forward bias is applied to the diode 34 thereby effectively grounding the anode 12 for signal frequencies, and shorting out or effectively disconnecting the tunable circuit 28. For these conditions the movable contact 56 is moved from the left to the ground tap 59 on the resistor 58 to apply a negative reverse bias to the diode 52, the magnitude of which controls the capacitance that the diode 52 presents to the tunable circuit 30. If desired, unicontrol operation of the tuning circuits may be effected by mechanical coupling of the contacts 40 and 56, such that when one of the contacts is positioned to apply a reverse bias to the diode associated therewith, the other contact is positioned to apply a forward bias to the diode connected thereto. Again, the feedback necessary to sustain oscillation for this grounded anode oscillator operation is provided by the interelectrode capacitance of the tube 10. It is to be understood that, with appropriate circuit changes, the oscillator could be made to operate in the grounded-anode mode for the high frequency band operation and in the grounded-grid mode for the low frequency band operation.

What is claimed is:

1. An electrical circuit comprising a pair of voltage-responsive capacity devices each responsive to reverse bias voltages in a range of voltages to exhibit capacitances, the magnitude of which is a function of the amplitude of the applied voltage while exhibiting a first level of impedance, and responsive to a forward bias voltage outside of said range of voltages to exhibit a second, substantially different impedance level, means providing a bias voltage source operable to produce reverse bias voltages in said range of voltages and a forward bias voltage outside of said range, and means for simultaneously applying said forward bias voltage outside of said range to said first device and applying a reverse bias voltage in said range to said second device to tune said circuit.

2. A tuning circuit comprising, means providing an inductance, a pair of voltage-responsive capacity devices each coupled to at least a portion of said inductance-providing means, said devices being responsive to voltages in a first range of voltages to exhibit capacitances, the magnitude of which is a function of the amplitude of the applied voltage, while exhibiting a first level of impedance, and being responsive to a voltage outside of said range of voltages to exhibit a second, substantially different impedance level, means connecting a first of said devices such that impedances at said second level effectively disables, for tuning purposes, the portion of said inductance providing means with which it is connected, means providing a bias voltage source operable to produce voltages in said range of voltages and said voltage outside of said range, and means for applying voltages in said range to said first of said devices to tune said circuit to a frequency in a first range of frequencies, and for applying said voltages outside of said range to said first device and applying a voltage in said range to said second device to tune said circuit to a frequency in a second range of frequencies.

3. A tuning system tunable over a first frequency range by a circuit portion and to a frequency outside of said first frequency range when said circuit portion is effectively disabled comprising, a diode which is responsive to a voltage in a range of reverse-bias voltages to exhibit a high impedance and a predetermined range of capacitance and responsive to a forward bias voltage to exhibit a low impedance, inductance means coupled to said diode means providing a bias voltage source for providing reverse-bias voltages in said range of voltages and a forward bias voltage, and means for applying a voltage in said range of voltages to said diode to tune said tuning system to a frequency in said first frequency range and for applying said forward bias voltage to said diode to effectively disable said circuit portion and condition said tuning system for tuning to said frequency outside of said first frequency range.

4. A multiband oscillator comprising an amplifying device having a plurality of electrodes, means providing first and second tunable circuits each including a voltage-responsive variable-capacitance diode, means for connecting said first tunable circuit to one of said electrodes, means connecting said second tunable circuit to another of said electrodes, and means for applying bias voltages to the variable-capacitance diodes in said first and second tunable circuits such that a reverse bias is applied to the diode in one of said circuits when a forward bias is applied to the diode in the other of said tunable circuits.

5. A multiband oscillator comprising an electron tube having an anode, a cathode and a control grid, means providing first and second tunable circuits, each including a voltage-responsive variable-capacitance diode connected in parallel with an inductor, means for connecting said first tunable circuit between said anode and ground for said oscillator, means connecting said second tunable circuit between said control grid and ground for said oscillator, means providing a bias voltage source, means for applying bias voltages from said source to said first and second tunable circuits in such a manner that when a reverse bias is applied to the diode of one of said circuits a forward bias is applied to the diode in the other of said circuits, the diode in the other of said circuits to which a forward bias is applied exhibiting a low impedance and effectively grounding the electrode to which it is connected, and means connecting the cathode with said first and second tunable circuits to sustain oscillations for either grounded-grid or grounded-anode operation of said oscillator.

6. A multiband oscillator comprising an amplifying device having a plurality of electrodes, means providing first and second tunable circuits each including a voltage-responsive variable-capacitance diode, means for connecting said first tunable circuit to one of said electrodes such that when the diode associated with said first tunable circuit is biased in the forward direction a low impedance path for signal frequencies is provided between said one electrode and ground for said oscillator, means connecting said second tunable circuit to a second of said electrodes such that when the diode associated with said second tunable circuit is biased in the forward direction a low impedance path for signal frequencies is provided between the second of said electrodes and ground for said oscillator, means providing a bias voltage source, means for applying bias voltages from said source to the variable-capacitance diodes in said first and second tunable circuits in such manner that when a reverse bias is applied to the diode in said first tunable circuit a forward bias is applied to the diode in said second tunable circuit so that said oscillator oscillates in a first mode of operation, and when a reverse bias is applied to the diode in said second tunable circuit a forward bias is applied to the diode in said first tunable circuit so that said oscillator oscillates in a second mode of operation.

References Cited in the file of this patent

UNITED STATES PATENTS

| | | |
|---|---|---|
| 2,182,377 | Guanella | Dec. 5, 1939 |
| 2,191,315 | Guanella | Feb. 20, 1940 |
| 2,964,646 | Helms | Dec. 13, 1960 |
| 3,010,015 | Pepperberg | Nov. 21, 1961 |